United States Patent
Nakasato

(10) Patent No.: US 12,334,374 B2
(45) Date of Patent: Jun. 17, 2025

(54) ABNORMALITY DETECTING APPARATUS, SEMICONDUCTOR MANUFACTURING APPARATUS, AND ABNORMALITY DETECTING METHOD

(71) Applicant: Tokyo Electron Limited, Tokyo (JP)

(72) Inventor: Yuka Nakasato, Yamanashi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 489 days.

(21) Appl. No.: 17/354,158

(22) Filed: Jun. 22, 2021

(65) Prior Publication Data

US 2021/0407835 A1 Dec. 30, 2021

(30) Foreign Application Priority Data

Jun. 30, 2020 (JP) .................... 2020-113510

(51) Int. Cl.
*H01L 21/67* (2006.01)
*G05B 23/02* (2006.01)

(52) U.S. Cl.
CPC .... *H01L 21/67288* (2013.01); *G05B 23/0205* (2013.01); *H01L 21/67253* (2013.01)

(58) Field of Classification Search
CPC ......... H01L 21/67288; H01L 21/67253; H01L 21/67276; G05B 23/0205; G05B 23/024
USPC ........................................................ 702/183
See application file for complete search history.

(56) References Cited

U.S. PATENT DOCUMENTS

| | | | | |
|---|---|---|---|---|
| 11,526,160 | B2* | 12/2022 | Nakasato | G05B 23/024 |
| 2008/0208385 | A1* | 8/2008 | Sakamoto | C23C 16/4412 700/121 |
| 2008/0262791 | A1* | 10/2008 | Terasawa | F27B 17/0025 392/416 |
| 2013/0342136 | A1* | 12/2013 | Ibori | H02M 5/458 318/380 |
| 2018/0138096 | A1* | 5/2018 | Koyama | G01R 31/26 |
| 2021/0124341 | A1* | 4/2021 | Nakasato | G05B 23/024 |
| 2021/0397169 | A1* | 12/2021 | Shoji | H01L 21/67248 |

FOREIGN PATENT DOCUMENTS

| | | | | |
|---|---|---|---|---|
| JP | 2006-186280 A | | 7/2006 | |
| JP | 2009-111165 A | | 5/2009 | |
| JP | 2011151986 A | * | 8/2011 | ............. G01R 35/00 |
| JP | 2021068831 A | * | 4/2021 | ......... G05B 19/4184 |
| WO | WO-2017199818 A1 | * | 11/2017 | ............. B01D 53/56 |

OTHER PUBLICATIONS

English translation of JP 2011151986, Aug. 2011. (Year: 2011).*
English translation of JP 2021068831, Apr. 30, 2021. (Year: 2021).*

* cited by examiner

*Primary Examiner* — Michael P Nghiem
(74) *Attorney, Agent, or Firm* — Venjuris, P.C.

(57) ABSTRACT

An abnormality detecting apparatus detects an abnormality of a semiconductor manufacturing apparatus, and includes: a data generator configured to generate correlation data based on a value of a first monitoring target and a value of a second monitoring target that are correlated with each other; a calculator configured to calculate a slop of a regression line of the correlation data based on the correlation data; and an abnormality determination device configured to determine an abnormality of the semiconductor manufacturing apparatus based on the slope of the regression line.

9 Claims, 9 Drawing Sheets

OUTPUT OF FIRST PIPE HEATER

OUTPUT OF FIRST PIPE HEATER

OPENING DEGREE OF FIRST PRESSURE CONTROL VALVE

OPENING DEGREE OF FIRST PRESSURE CONTROL VALVE

ABNORMALITY DETECTING APPARATUS, SEMICONDUCTOR MANUFACTURING APPARATUS, AND ABNORMALITY DETECTING METHOD

CROSS-REFERENCE TO RELATED APPLICATIONS

This application is based on and claims priority from Japanese Patent Application No. 2020-113510 filed on Jun. 30, 2020 with the Japan Patent Office, the disclosure of which is incorporated herein in its entirety by reference.

TECHNICAL FIELD

The present disclosure relates to an abnormality detecting apparatus, a semiconductor manufacturing apparatus, and an abnormality detecting method.

BACKGROUND

In a semiconductor manufacturing apparatus, a technique of detecting an abnormality of the apparatus is known (see, e.g., Japanese Laid-Open Patent Publication No. 2006-186280). In Japanese Laid-Open Patent Publication No. 2006-186280, the boundary data that defines a boundary between a normal region and an abnormal region are generated in a biaxial coordinate system based on correlation data between a first monitored object and a second monitored object that influences the first monitored object, and when the position of the correlation data determined by the values of both of the objects falls within the abnormal region, it is determined that an abnormality occurs.

SUMMARY

According to an aspect of the present disclosure, an abnormality detecting apparatus detects an abnormality of a semiconductor manufacturing apparatus, and includes: a data generator configured to generate correlation data based on a value of a first monitoring target and a value of a second monitoring target that are correlated with each other; a calculator configured to calculate a slop of a regression line of the correlation data based on the correlation data; and an abnormality determiner configured to determine an abnormality of the semiconductor manufacturing apparatus based on the slope of the regression line.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
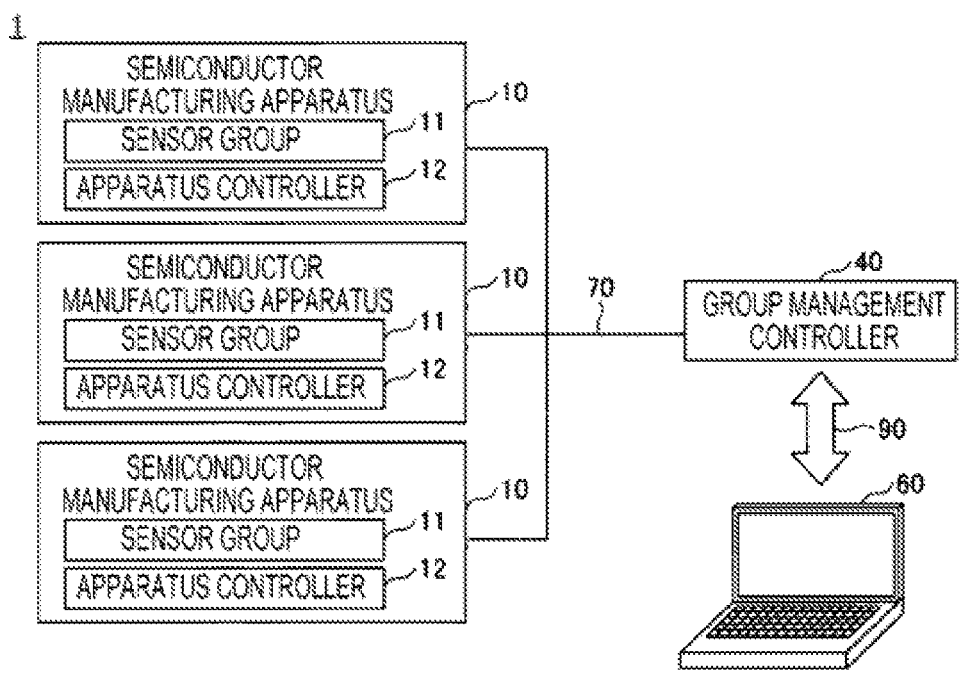
FIG. 1A is a view illustrating an example of an overall configuration of a system.

In the following detailed description, reference is made to the accompanying drawings which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, a non-limiting embodiment of the present disclosure will be described with reference to the accompanying drawings. In all of the drawings, the same or corresponding members or components will be denoted by the same or corresponding reference numerals, and overlapping descriptions thereof will be omitted.

[System]

Figure 1B:
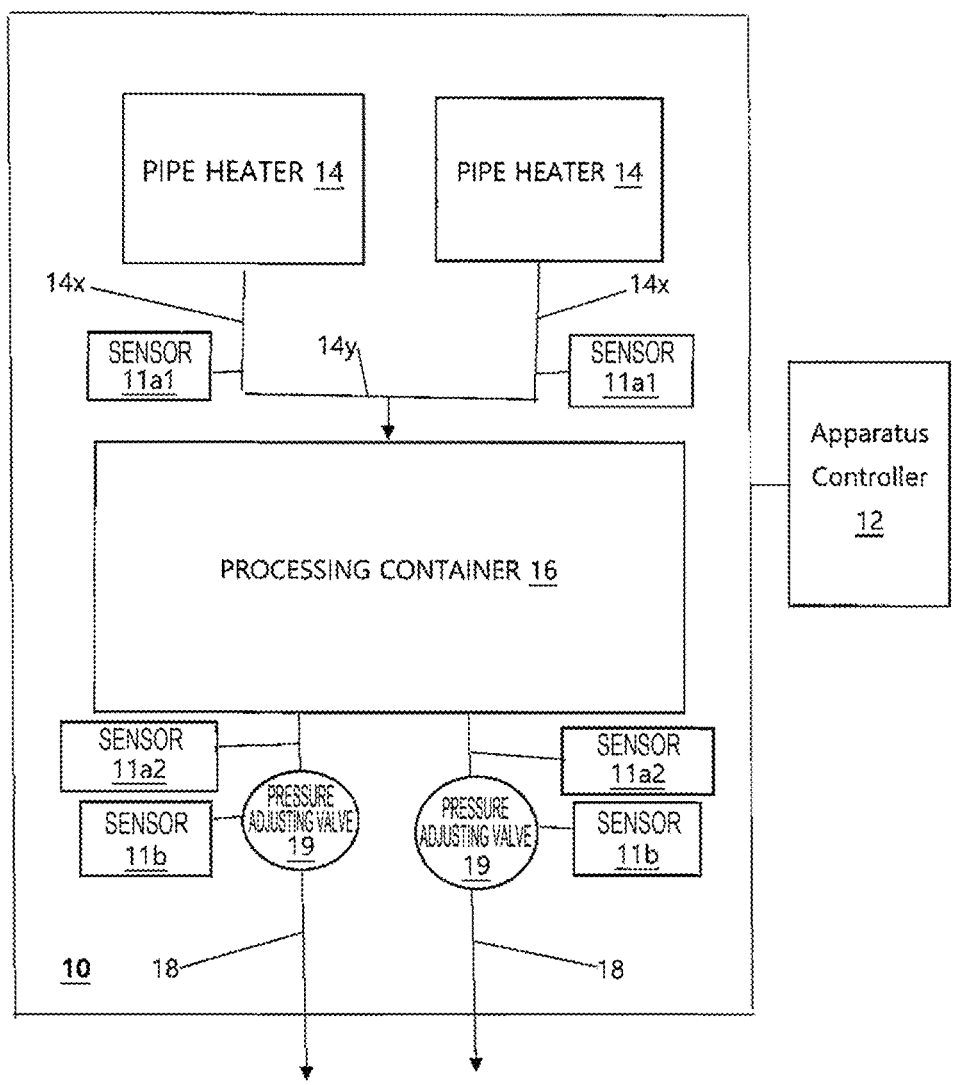
FIG. 1B is a block diagram of a semiconductor manufacturing apparatus of the system.

Referring to FIGS. 1A and 1B, the overall configuration of the system will be described. FIG. 1A is a view illustrating an example of the overall configuration of the system.

A system 1 includes three semiconductor manufacturing apparatuses 10, a group management controller 40, and a terminal 60. Each semiconductor manufacturing apparatus 10 is communicably connected to the group management controller 40 via a network 70. The group management controller 40 is communicably connected to the terminal 60 via a network 90. While FIG. 1A represents three semiconductor manufacturing apparatuses 10, the number of semiconductor manufacturing apparatuses may be two or less, or four or more.

[Semiconductor Manufacturing Apparatus]

Each semiconductor manufacturing apparatus 10 executes various semiconductor manufacturing processes. The semiconductor manufacturing processes include various processes for manufacturing a semiconductor device, such as, for example, a film forming process, an etching process, and a heating process. The semiconductor manufacturing apparatus 10 includes a sensor group 11 and an apparatus controller 12.

Referring also to FIG. 1B, the sensor group 11a1, 11a2, and 11b includes various sensors for detecting the state of the semiconductor manufacturing apparatus 10, such as, for example, a sensor(s) 11a1 for detecting an output of a pipe heater 14 (hereinafter, also referred to as an "output detecting sensor"), and a sensor(s) 11b for detecting an opening degree of a pressure adjusting valve 19 (hereinafter, also referred to as an "opening degree detecting sensor"). The output detecting sensor 11a1 detects an output of a pipe heater 14 attached to a supply pipe 14x that supplies a gas into a processing container 16 or an exhaust pipe 18, by the sensors 11a2, that exhausts the inside of the processing container 16. The opening degree detecting sensor 11b detects an opening degree of a pressure adjusting (control)

valve 19 provided in an exhaust pipe 18 that exhausts the inside of the processing container 16.

The apparatus controller 12 controls the operation of each unit of the semiconductor manufacturing apparatus 10, so as to execute the various semiconductor manufacturing processes in the semiconductor manufacturing apparatus 10. The apparatus controller 12 may be, for example, a computer.

The semiconductor manufacturing apparatus 10 may be, for example, a cluster type apparatus in which a plurality of processing chambers is arranged around a transfer chamber, or an in-line type apparatus in which one processing chamber is disposed in one transfer chamber. Further, the semiconductor manufacturing apparatus 10 may be, for example, any of a single-wafer type apparatus, a semi-batch type apparatus, and a batch type apparatus. The single-wafer type apparatus is, for example, an apparatus that processes wafers one by one in a processing chamber. The semi-batch type apparatus is, for example, an apparatus in which a plurality of wafers placed on a rotary table in a processing chamber is revolved by the rotary table, so that each wafer passes through a region where a raw material gas is supplied and a region where a reaction gas that reacts with the raw material gas is supplied, in an order, thereby forming a film on the surface of the wafer. The batch type apparatus is, for example, an apparatus in which a processing chamber accommodates a wafer boat that holds a plurality of wafers horizontally at predetermined intervals in the height direction, thereby processing the plurality of wafers at once.

The semiconductor manufacturing apparatus 10 may be communicably connected to a host computer (not illustrated) via a network. The host computer may be connected to a device other than the semiconductor manufacturing apparatus 10 in a semiconductor factory, such as, for example, an inspection device for inspecting a semiconductor device manufactured by the semiconductor manufacturing apparatus 10 via a network. The inspection device includes, for example, a film thickness measuring device, an electrical characteristic measuring device, an optical characteristic measuring device, and a particle measuring device.

[Group Management Controller]

The group management controller 40 acquires a plurality of sensor values detected by the sensor group 11 while the semiconductor manufacturing apparatus 10 is executing a semiconductor manufacturing process, and executes an abnormality detecting method to be described later, based on the plurality of sensor values.

Figure 2:
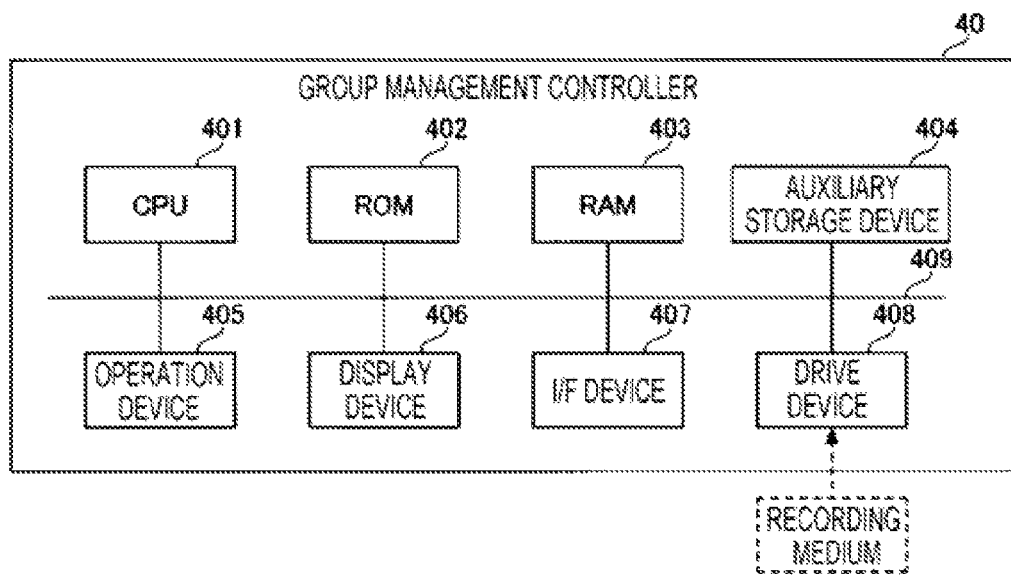
FIG. 2 is a view illustrating an example of a hardware configuration of a group management controller.

Referring to FIG. 2, the hardware configuration of the group management controller 40 will be described. FIG. 2 is a view illustrating an example of the hardware configuration of the group management controller 40.

The group management controller 40 includes a central processing unit (CPU) 401, a read only memory (ROM) 402, and a random access memory (RAM) 403. The CPU 401, the ROM 402, and the RAM 403 make up a so-called computer. The group management controller 40 further includes an auxiliary storage device 404, an operation device 405, a display device 406, an interface (I/F) device 407, and a drive device 408. The hardware components of the group management controller 40 are connected to each other via a bus 409.

The CPU 401 executes various programs installed in the auxiliary storage device 404.

The ROM 402 is a non-volatile memory, and functions as a main storage device. The ROM 402 stores various programs, information and others that are necessary when the CPU 401 executes the various programs installed in the auxiliary storage device 404.

The RAM 403 is a volatile memory such as a dynamic random access memory (DRAM) or a static random access memory (SRAM), and functions as a main storage device. The RAM 403 provides a work area where programs are to be developed when the CPU 401 executes the various programs installed in the auxiliary storage device 404.

The auxiliary storage device 404 stores various programs, or sensor values detected by the sensor group 11 when the CPU 401 executes the various programs.

The operation device 405 is an input device used when an operator inputs various instructions to the group management controller 40.

The display device 406 displays internal information of the group management controller 40.

The I/F device 407 is a connection device that is connected to the network 70 to communicate with the semiconductor manufacturing apparatus 10.

The drive device 408 is a device that performs a writing and a reading with respect to a recording medium. The recording medium includes, for example, a CD-ROM, a flexible disk, a magneto-optical disk, a ROM, and a flash memory.

For example, the various programs installed in the auxiliary storage device 404 are installed in the manner that a distributed recording medium is inserted into the drive device 408, and various programs recorded in the recording medium are read by the drive device 408.

Figure 3:
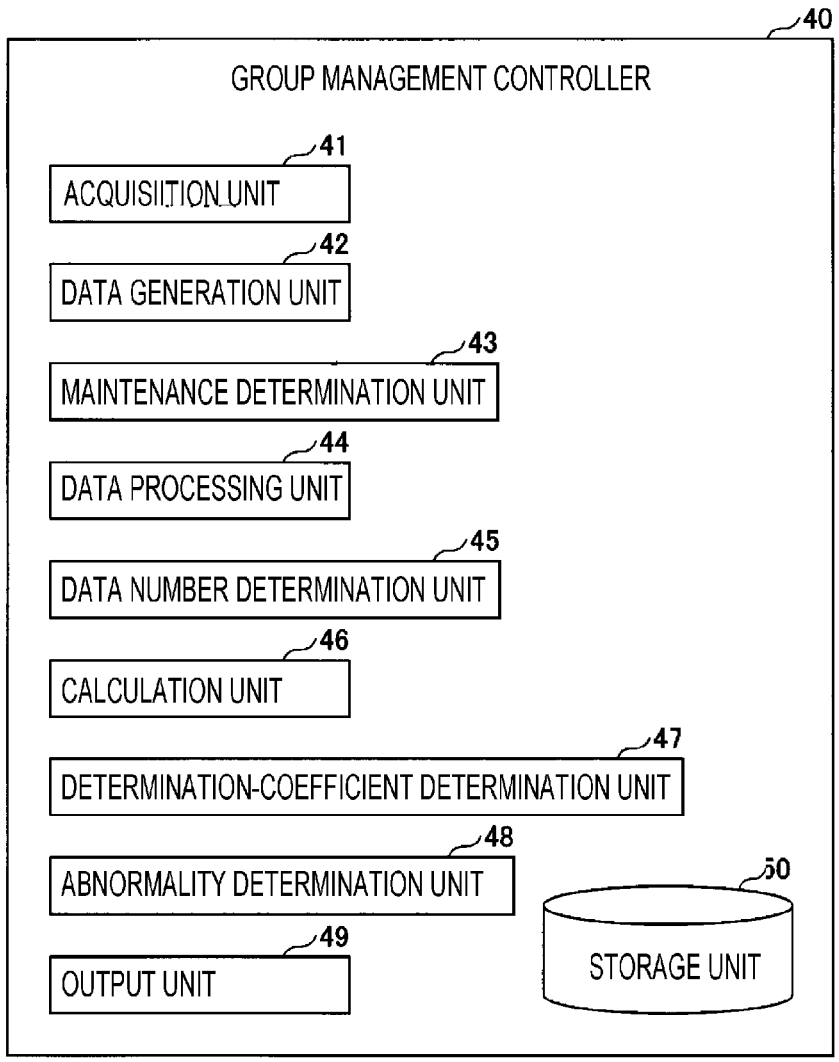
FIG. 3 is a view illustrating an example of a functional configuration of the group management controller.

Referring to FIGS. 3 to 7A and 7B, the functional configuration of the group management controller 40 will be described. FIG. 3 is a view illustrating an example of the functional configuration of the group management controller 40.

The group management controller 40 includes an acquisition unit 41, a data generation unit 42, a maintenance determination unit 43, a data processing unit 44, a number-of-data determination unit 45, a calculation unit 46, a determination-coefficient determination unit 47, an abnormality determination unit 48, an output unit 49, and a storage unit 50.

The acquisition unit 41 acquires a plurality of sensor values detected by the sensor group 11a1, 11a2, and 11b while the semiconductor manufacturing apparatus 10 is executing a semiconductor manufacturing process. The plurality of sensor values include sensor values correlated with each other. The sensor values correlated with each other may be, for example, sensor values of two output detecting sensors 11al that detect outputs of two pipe heaters 14 attached to the same pipe 14y to be adjacent to each other. The pipe 14y includes, for example, a supply pipe that supplies a gas into the processing container 16, and an exhaust pipe 18 that exhausts the inside of the processing container 16. Further, the sensor 11a1, 11a2, and 11b values correlated with each other may be, for example, sensor values of two opening degree detecting sensors 11b that detect opening degrees of two pressure control valves 19 provided in two different exhaust pipes 18, respectively, connected to the inside of the same processing container 16. Further, the acquisition unit 41 acquires information on time periods corresponding to the sensor 11a1, 11a2, and 11b values.

Figure 4:
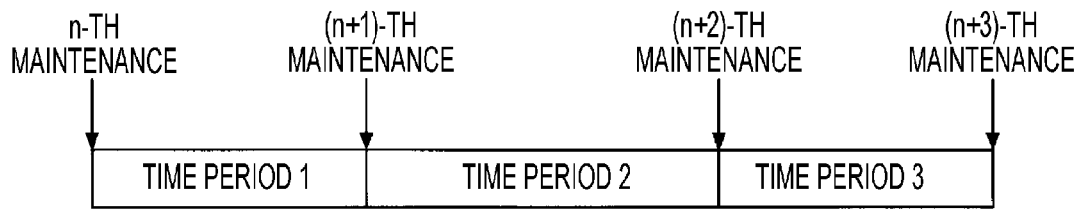
FIG. 4 is a view illustrating information on time periods.

FIG. 4 is a view illustrating the information on time periods. For example, as illustrated in FIG. 4, information on a time period is determined by setting a time period from the performance of maintenance in the semiconductor manufacturing apparatus 10 to the next maintenance, as one time period. For example, "Time Period 1" is a time period from the performance of n-th maintenance to an (n+1)-th maintenance. "Time Period 2" is a time period from the performance of the (n+1)-th maintenance to an (n+2)-th maintenance. "Time Period 3" is a time period from the performance of the (n+2)-th maintenance to an (n+3)-th maintenance. The "n" is an integer of 1 or more. For example, a plurality of sensor values detected by the sensor group 11 while the semiconductor manufacturing process is executed during "Time Period 1" correspond to "Time Period 1."

Based on at least two sensor values correlated with each other among the plurality of sensor values acquired by the acquisition unit 41, and the information on time periods, the data generation unit 42 generates point data in which the two sensor values and information on the time periods correspond to each other. Further, the data generation unit 42 adds the generated point data to a point data list stored in the storage unit 50.

Figure 5A:
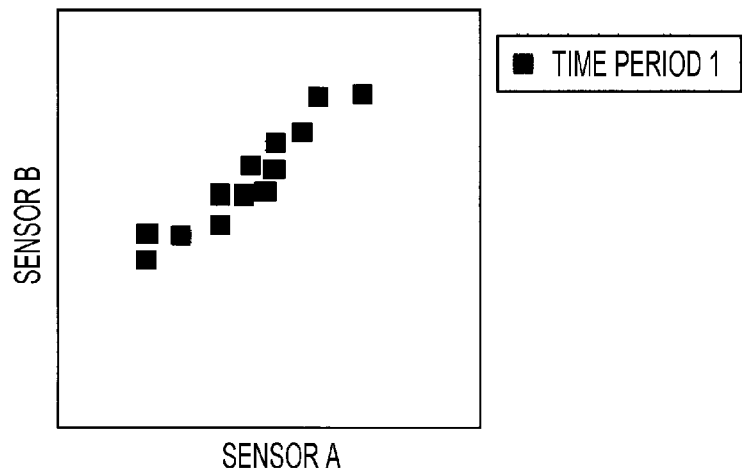
FIGS. 5A to 5C are views illustrating a point data list.
Figure 5B:
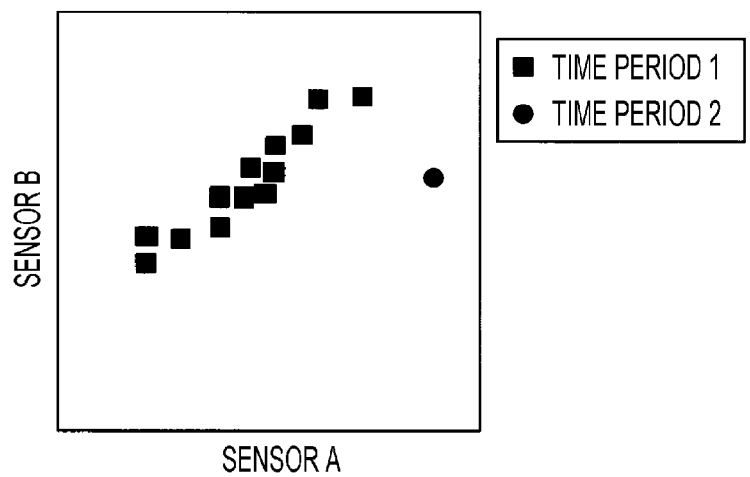
Figure 5C:
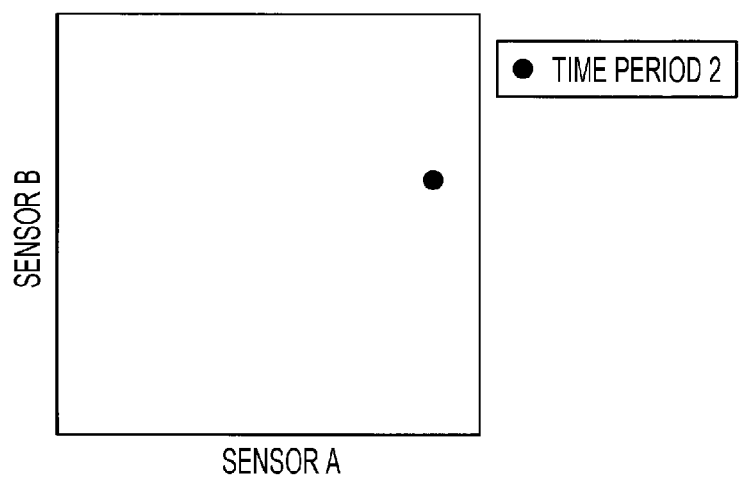

FIGS. 5A to 5C are views illustrating the point data list. The point data list may be, for example, a scatter plot that represents a correlation between a sensor value of a sensor A and a sensor value of a sensor B, as illustrated in FIGS. 5A to 5C. Each of the scatter plots illustrated in FIGS. 5A to 5C is a scatter plot in which the horizontal axis represents a sensor value of the sensor A, and the vertical axis represents a sensor value of the sensor B, and a plurality of point data may be plotted on the scatter diagram. Further, in FIGS. 5A to 5C, a square mark indicates point data in "Time Period 1," and a circle mark indicates point data in "Time Period 2."

The maintenance determination unit 43 determines whether the point data list includes point data for a plurality of time periods. For example, when the scatter plot includes the point data of "Time Period 1" and the point data of "Time Period 2" as represented in FIG. 5B, the maintenance determination unit 43 determines that the point data list includes point data for a plurality of time periods. Further, for example, when the scatter plot includes only the point data of "Time Period 1" as represented in FIG. 5A, the maintenance determination unit 43 determines that the point data list does not include point data for a plurality of time periods. Further, for example, when the scatter plot includes only the point data of "Time Period 2" as represented in FIG. 5C, the maintenance determination unit 43 determines that the point data list does not include point data for a plurality of time periods.

When the point data list includes point data for a plurality of time periods, the data processing unit 44 performs a process of deleting point data other than point data that belong to the latest time period, from the point data list (hereinafter, referred to as a "reset of the point data list"). For example, when the scatter plot includes the point data that belong to "Time Period 1" and the point data that belong to "Time Period 2" as represented in FIG. 5B, the data processing unit 44 deletes the point data that belong to "Time Period 1" from the scatter plot as represented in FIG. 5C.

The number-of-data determination unit 45 determines whether the point data list includes a predetermined number of or more point data. The predetermined number is a value determined by a device manager or the like, and may be, for example, any of 5 to 10. For example, when the point data list is the scatter plot represented in FIG. 5A, the number of point data is 13, and thus, the number-of-data determination unit 45 determines that the point data list includes the predetermined number of or more point data. Further, for example, when the point data list is the scatter plot represented in FIG. 5C, the number of point data is 1, and thus, the number-of-data determination unit 45 determines that the point data list does not include the predetermined number of or more point data.

Based on the plurality of point data included in the point data list, the calculation unit 46 calculates the slope of the regression line and the determination coefficient of the regression line.

The determination-coefficient determination unit 47 determines whether the determination coefficient of the regression line calculated by the calculation unit 46 is equal to or more than a control value. The control value is, for example, a value in a range of 0.01 to 0.99, and is designated by a device manager or the like using, for example, the terminal 60.

The abnormality determination unit 48 determines whether the slope of the regression line calculated by the calculation unit 46 falls outside the control value. The abnormality determination unit 48 determines that the semiconductor manufacturing apparatus 10 is abnormal when the slope of the regression line falls outside the control value, and determines that the semiconductor manufacturing apparatus 10 is not abnormal when the slope of the regression line does not fall outside the control value.

Figure 6A:
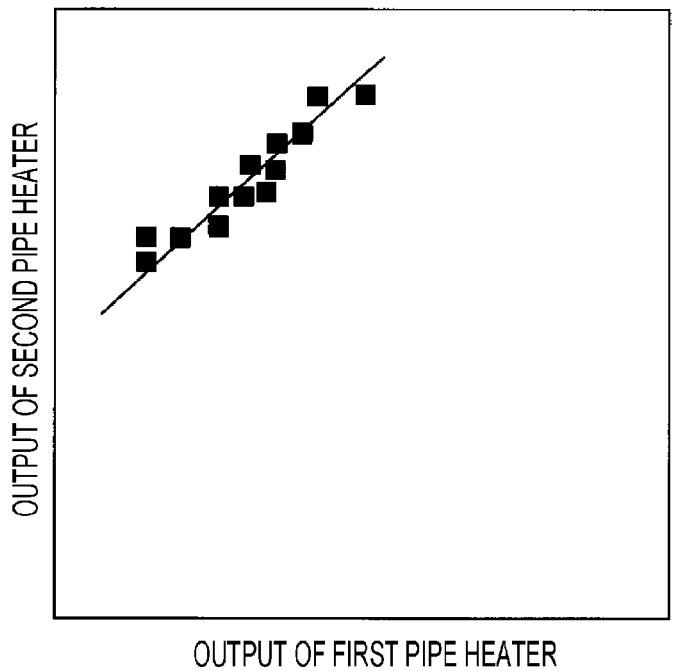
FIGS. 6A and 6B are views illustrating an example of a relationship between an output of a first pipe heater and an output of a second pipe heater.
Figure 6B:
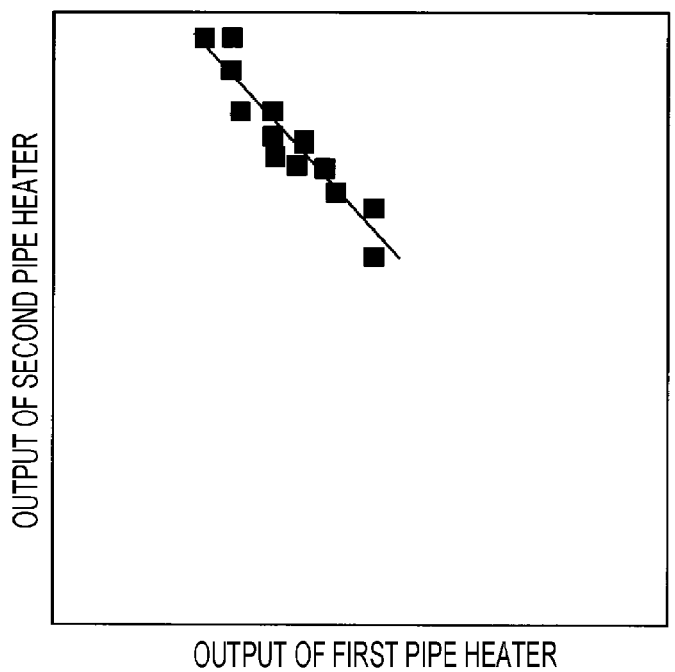

FIGS. 6A and 6B are views illustrating an example of a relationship between an output of a first pipe heater and an output of a second pipe heater. FIGS. 6A and 6B are scatter plots illustrating the correlation between the output of the first pipe heater 14 and the output of the second pipe heater 14, and in each of the scatter plots, the horizontal axis represents the output of the first pipe heater, and the vertical axis represents the output of the second pipe heater. It is assumed that when the first pipe heater 14 and the second pipe heater 14 are correctly attached to the exhaust pipe 14$x$, 14$y$ the outputs of the two pipe heaters represents a positive correlation, and when an abnormality such as a construction failure occurs in one of the two pipe heaters 14, the outputs of the two pipe heaters 14 represent a negative correlation. In this case, the control value is set to a "positive value." As a result, when the slope of the regression line calculated based on the scatter plot is the "positive value" as represented in FIG. 6A, the abnormality determination unit 48 determines that the calculated slope of the regression line does not fall outside the control value, and thus, determines that the semiconductor manufacturing apparatus 10 is not abnormal. Meanwhile, when the slope of the regression line calculated based on the scatter plot is the "negative value" as represented in FIG. 6B, the abnormality determination unit 48 determines that the calculated slope of the regression line falls outside the control value, and thus, determines that the semiconductor manufacturing apparatus 10 is abnormal. Further, the first pipe heater 14 and the second pipe heater 14 are, for example, two pipe heaters 14 attached to the same exhaust pipe 14$x$, 14$y$ to be adjacent to each other.

Figure 7A:
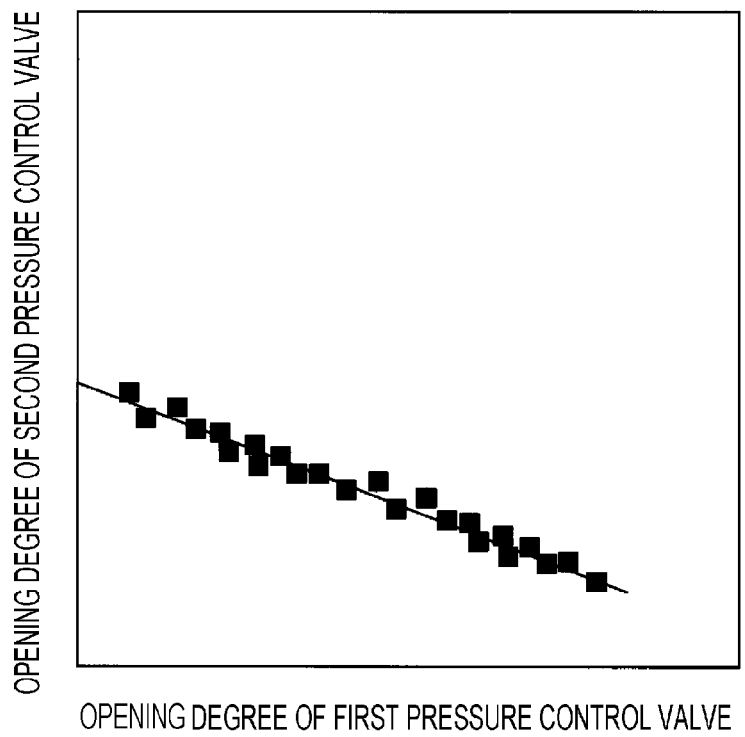
FIGS. 7A and 7B are views illustrating an example of a relationship between an opening degree of a first pressure control valve and an opening degree of a second pressure control valve.
Figure 7B:
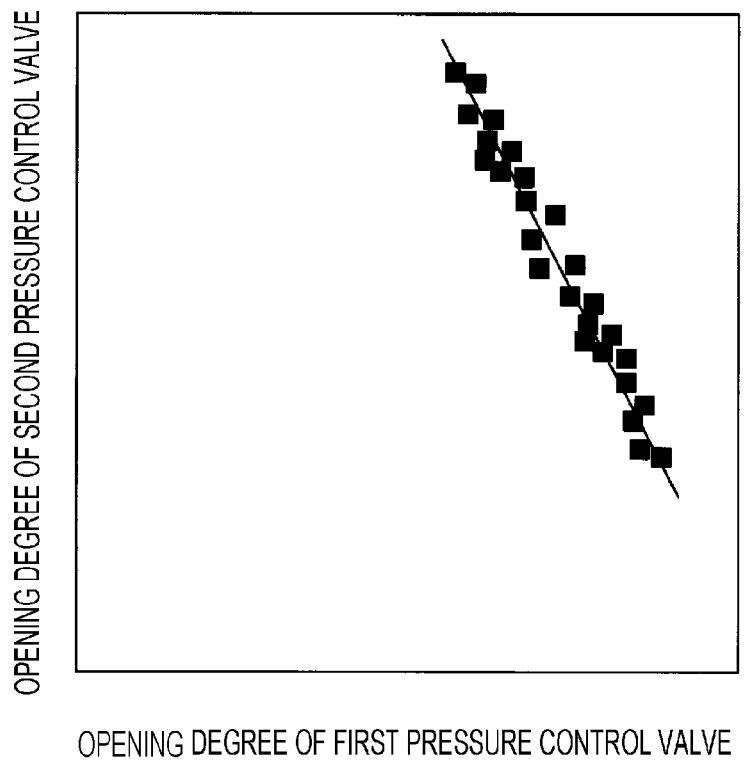

FIGS. 7A and 7B are views illustrating an example of a relationship between an opening degree of a first pressure control valve and an opening degree of a second pressure control valve. FIGS. 7A and 7B are scatter plots that represent the correlation between the opening degree of the first pressure control valve and the opening degree of the second pressure control valve, and in each of the scatter plots, the horizontal axis represents the opening degree of the first pressure control valve, and the vertical axis represents the opening degree of the second pressure control valve. It is assumed that when the first pressure control valve and the second pressure control valve are operating normally, the absolute value of the slope of the regression line calculated based on each of the scatter plots of the opening degrees of the two pressure control valves represents 1 or less. Further, it is assumed that when either the first pressure control valve or the second pressure control valve is abnormal, the absolute value of the slope of the regression line represents a value larger than 1. In this case, the control value is set to the "absolute value of 1 or less." As a result, when the absolute value of the slope of the regression line calculated based on the scatter plot is 1 or less as represented in FIG. 7A, the abnormality determination unit 48 determines that the calculated slope of the regression line does not fall outside the control value, and thus, determines that the semiconductor manufacturing apparatus 10 is not abnormal. Meanwhile, when the absolute value of the slope of the regression line calculated based on the scatter plot is larger than 1 as represented in FIG. 7B, the abnormality determination unit 48 determines that the calculated slope of the regression line falls outside the control value, and thus, determines that the semiconductor manufacturing apparatus 10 is abnormal. The first pressure adjusting valve and the second pressure adjusting valve are, for example, two pressure control valves provided in two different exhaust pipes, respectively, connected to the inside of the same processing container.

The output unit 49 notifies the semiconductor manufacturing apparatus 10 of an alarm. For example, the output unit 49 outputs an alarm signal to the semiconductor manufacturing apparatus 10. When the alarm signal is received, the semiconductor manufacturing apparatus 10 displays the occurrence of the alarm on a display unit (not illustrated) of the semiconductor manufacturing apparatus 10. Further, when the alarm signal is received, the semiconductor manufacturing apparatus 10 stops the semiconductor manufacturing process that is being executed, or completes the semiconductor manufacturing process that is being executed, and then, stops the semiconductor manufacturing process.

The storage unit 50 stores the plurality of sensor values acquired by the acquisition unit 41, the point data list generated by the data generation unit 42, and the slope and the determination coefficient of the regression line that are calculated by the calculation unit 46. Further, the storage unit 50 stores the determination results by the maintenance determination unit 43, the number-of-data determination unit 45, the determination-coefficient determination unit 47, and the abnormality determination unit 48.

[Abnormality Detecting Method]

Figure 8:
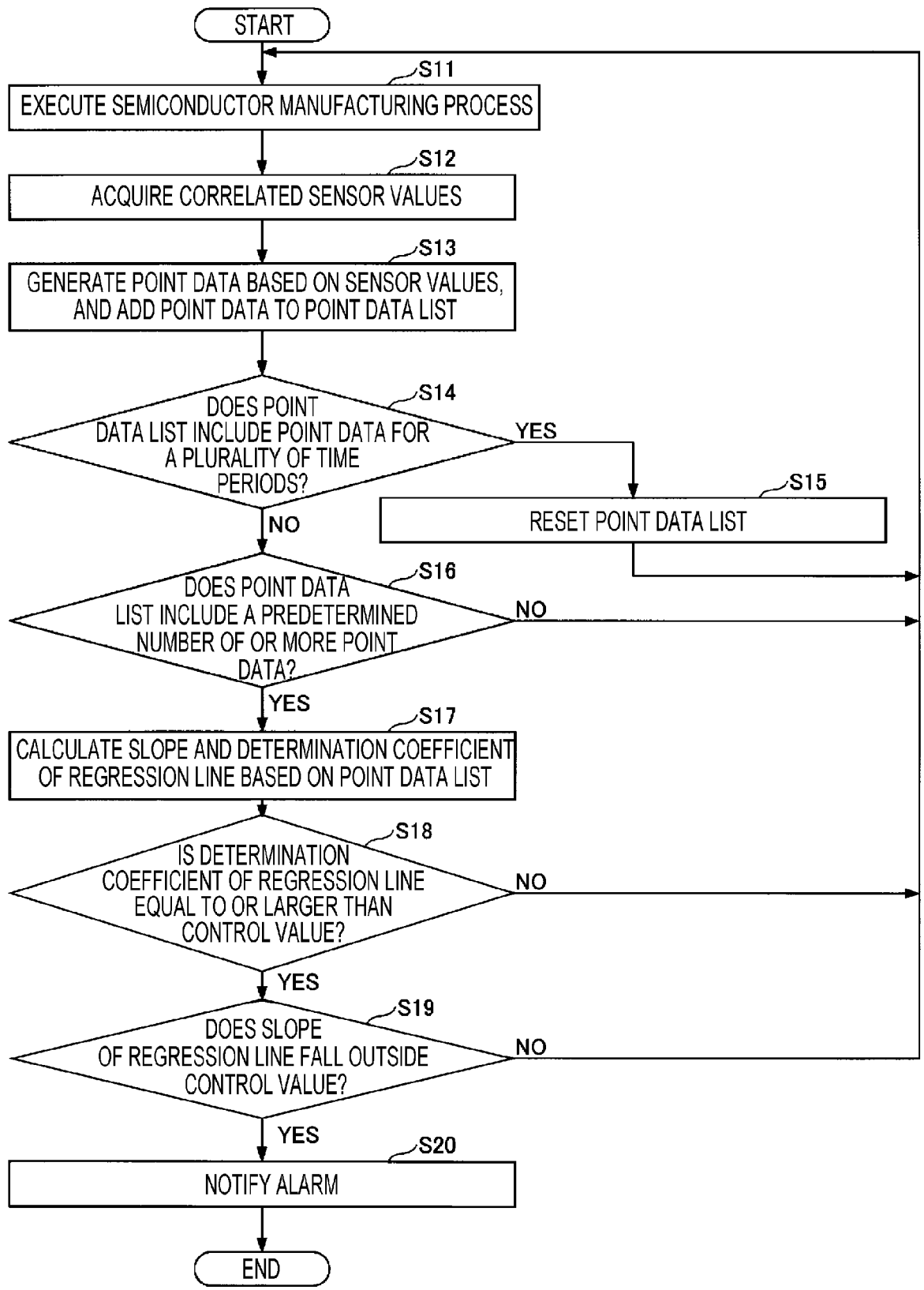
FIG. 8 is a flowchart illustrating an example of an abnormality detecting method.

Referring to FIG. 8, a method of detecting an abnormality of the semiconductor manufacturing apparatus 10 (hereinafter referred to as an "abnormality detecting method") will be described. In the descriptions hereinafter, an abnormality detecting method that is performed for one of the plurality of semiconductor manufacturing apparatuses 10 will be described as an example. FIG. 8 is a flowchart illustrating an example of the abnormality detecting method.

In step S11, the group management controller 40 causes the semiconductor manufacturing apparatus 10 to execute a semiconductor manufacturing process under predetermined process conditions. The predetermined process conditions are predetermined by, for example, a process recipe. At this time, the sensor group 11 detects the state of the semiconductor manufacturing apparatus 10. The sensor values detected by the sensor group 11 include sensor values correlated with each other.

In step S12, the group management controller 40 acquires two sensor values correlated with each other among the plurality of sensor values detected by the sensor group 11 in step S11. Further, the group management controller 40 acquires information on time periods corresponding to the sensor values.

In step S13, the group management controller 40 generates point data in which the two mutually correlated sensor values and the information on time periods that are acquired in step S12. Further, the group management controller 40 adds the generated point data to the point data list stored in the storage unit 50.

In step S14, the group management controller 40 determines whether the point data list to which the point data are added in step S13 includes point data for a plurality of time periods. When it is determined in step S14 that the point data list includes point data for a plurality of time periods, the group management controller 40 causes the process to proceed to step S15. Meanwhile, when it is determined in step S14 that the point data list does not include point data for a plurality of time periods, the group management controller 40 causes the process to proceed to step S16.

In step S15, the group management controller 40 resets the point data list, and then, returns the process to step S11.

In step S16, the group management controller 40 determines whether the point data list includes the predetermined number of or more point data. When it is determined in step S16 that the point data list includes the predetermined number of or more point data, the group management controller 40 causes the process to proceed to step S17. Meanwhile, when it is determined in step S16 that the point data list does not include the predetermined number of or more point data, the group management controller 40 returns the process to step S11. In step S16, it is determined whether the point data list includes the predetermined number of or more point data, so that the accuracy of the determination of an abnormality in the semiconductor manufacturing apparatus 10 may be improved.

In step S17, the group management controller 40 calculates the slope of the regression line and the determination coefficient of the regression line based on the plurality of point data included in the point data list.

In step S18, the group management controller 40 determines whether the determination coefficient of the regression line is equal to or more than the control value. When it is determined in step S18 that the determination coefficient of the regression line is equal to or more than the control value, the group management controller 40 causes the process to proceed to step S19. Meanwhile, when it is determined in step S18 that the determination coefficient of the regression line is less than the control value, the group management controller 40 returns the process to step S19. In step S18, it is determined whether the determination coefficient of the regression line is equal to or more than the control value, so that the accuracy of the determination of an abnormality in the semiconductor manufacturing apparatus 10 may be improved.

In step S19, the group management controller 40 determines whether the slope of the regression line falls outside the control value. When it is determined in step S19 that the slope of the regression line falls outside the control value, the group management controller 40 causes the process to proceed to step S20. Meanwhile, when it is determined in step S19 that the slope of the regression line does not fall outside the control value, the group management controller 40 returns the process to step S11.

In step S20, the group management controller 40 determines that the semiconductor manufacturing apparatus 10 is abnormal, notifies the semiconductor manufacturing apparatus 10 of an alarm, and then, ends the process.

As described above, according to the embodiment, the group management controller 40 generates the point data list based on two sensor values correlated with each other. Then, the group management controller 40 calculates the slope of the regression line based on the generated point data list, and determines an abnormality of the semiconductor manufacturing apparatus 10 based on the slope of the regression line. In this way, by grasping the change in correlation between the sensors, an abnormality sign of the semiconductor manufacturing apparatus 10 may be detected in advance.

Further, according to the embodiment, when the point data list does not include the point data for a plurality of time periods, the group management controller 40 determines whether the semiconductor manufacturing apparatus 10 is abnormal. That is, the group management controller 40 determines an abnormality of the semiconductor manufacturing apparatus 10 within a time period defined by the maintenance. As a result, even when a detection value of a sensor shifts before and after a maintenance, an abnormality of the semiconductor manufacturing apparatus 10 may be accurately detected.

In the embodiment above, descriptions are made on a case where the group management controller 40 determines whether the point data list includes the predetermined number of or more point data, in step S16. However, step S16 may be omitted. In the embodiment above, descriptions are made on a case where the group management controller 40 determines whether the determination coefficient of the regression line is equal to or more than the control value, in step S18. However, step S18 may be omitted. However, from the viewpoint of improving the accuracy of the determination of an abnormality in the semiconductor manufacturing apparatus 10, at least one of steps S16 and S18 may be performed.

In the embodiment above, descriptions are made on a case where the point data list is generated based on two sensor values correlated with each other, the slope of the regression line is calculated based on the point data list, and an abnormality of the semiconductor manufacturing apparatus 10 is determined based on the slope of the regression line. However, the present disclosure is not limited thereto. For example, a plurality of point data lists may be generated based on three or more sensor values correlated with each other, the slope of the regression line may be calculated for each of the plurality of point data lists, and an abnormality of the semiconductor manufacturing apparatus 10 may be determined based on the plurality of slopes of regression lines.

For example, when there are the output of the first pipe heater, the output of the second pipe heater, and an output of a third pipe heater which are positively correlated with each other, the group management controller 40 generates a plurality of scatter plots based on the outputs of the first pipe heater, the second pipe heater, and the third pipe heater.

Figure 9A:
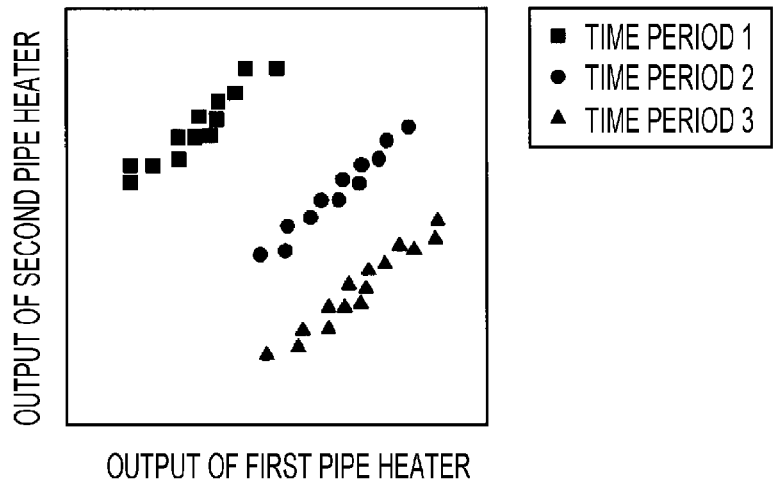
FIGS. 9A to 9C are views (parts 1) illustrating another example of the point data list.
Figure 9B:
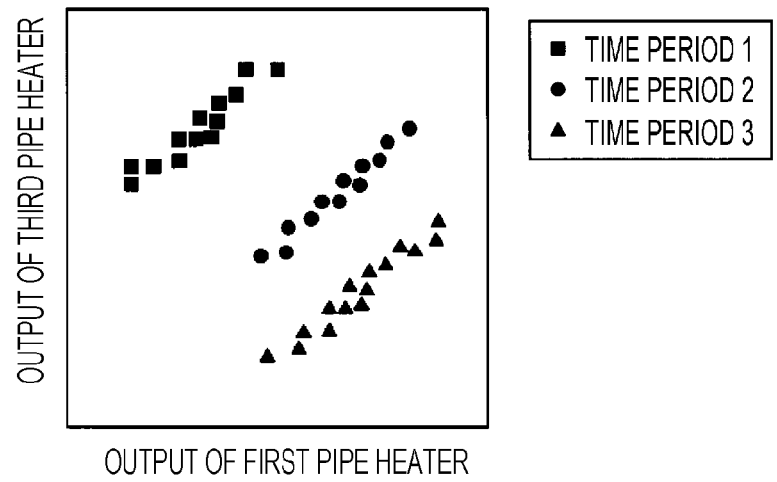
Figure 9C:
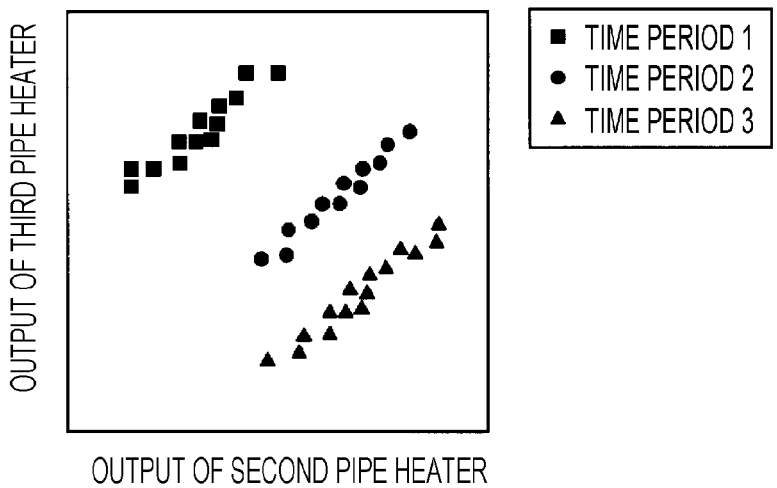

FIGS. 9A to 9C are views illustrating another example of the point data list, and represent a case where all of the sensor for detecting the output of the first pipe heater, the sensor for detecting the output of the second pipe heater, and the sensor for detecting the output of the third pipe heater are normal. FIG. 9A is a scatter plot that represents the correlation between the output of the first pipe heater and the output of the second pipe heater, in which the horizontal axis represents the output of the first pipe heater, and the vertical axis represents the output of the second pipe heater. FIG. 9B is a scatter plot that represents the correlation between the output of the first pipe heater and the output of the third pipe heater, in which the horizontal axis represents the output of the first pipe heater, and the vertical axis represents the output of the third pipe heater. FIG. 9C is a scatter plot that represents the correlation between the output of the second pipe heater and the output of the third pipe heater, in which the horizontal axis represents the output of the second pipe heater, and the vertical axis represents the output of the third pipe heater. In FIGS. 9A to 9C, a square mark indicates point data in "Time Period 1," a circle mark indicates point data in "Time Period 2," and a triangle mark indicates point data in "Time Period 3."

As illustrated in FIG. 9A, the slope of the regression line calculated based on the scatter plot that represents the correlation between the output of the first pipe heater and the output of the second pipe heater is a "positive value." Further, as illustrated in FIG. 9B, the slope of the regression line calculated based on the scatter plot that represents the correlation between the output of the first pipe heater and the output of the third pipe heater is a "positive value." Further, as illustrated in FIG. 9C, the slope of the regression line calculated based on the scatter plot that represents the correlation between the output of the second pipe heater and the output of the third pipe heater is a "positive value." From the three scatter plots, it may be determined that the sensor for detecting the output of the first pipe heater, the sensor for detecting the output of the second pipe heater, and the sensor for detecting the output of the third pipe heater are normal.

Figure 10A:
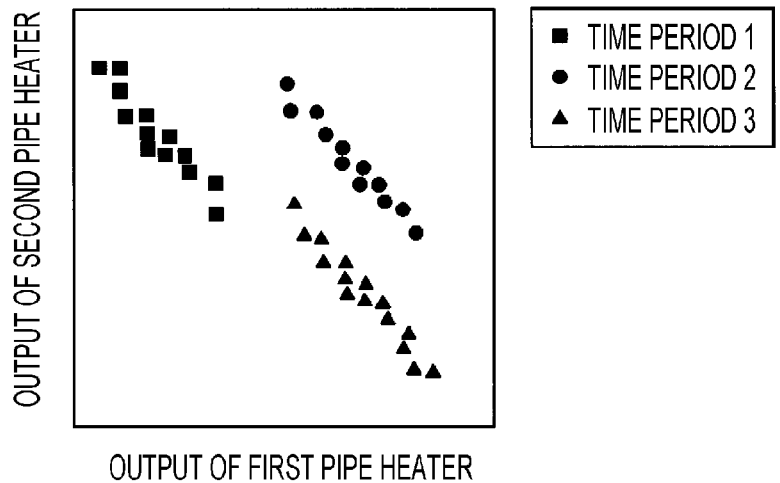
FIGS. 10A to 10C are views (parts 2) illustrating yet another example of the point data list.
Figure 10B:
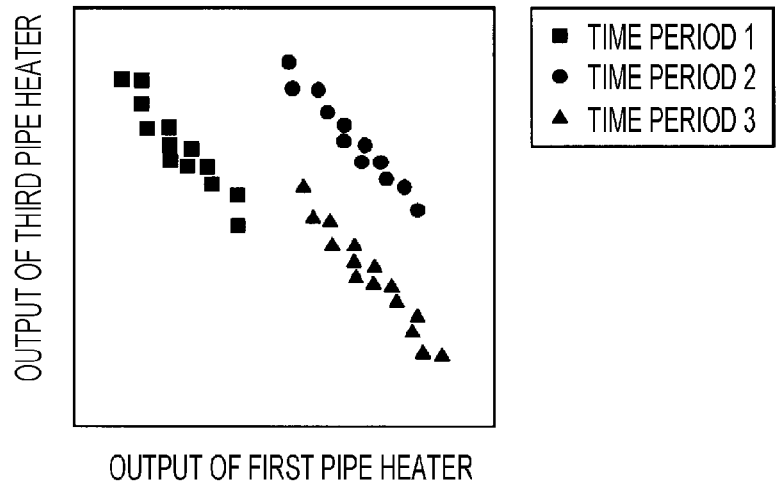
Figure 10C:
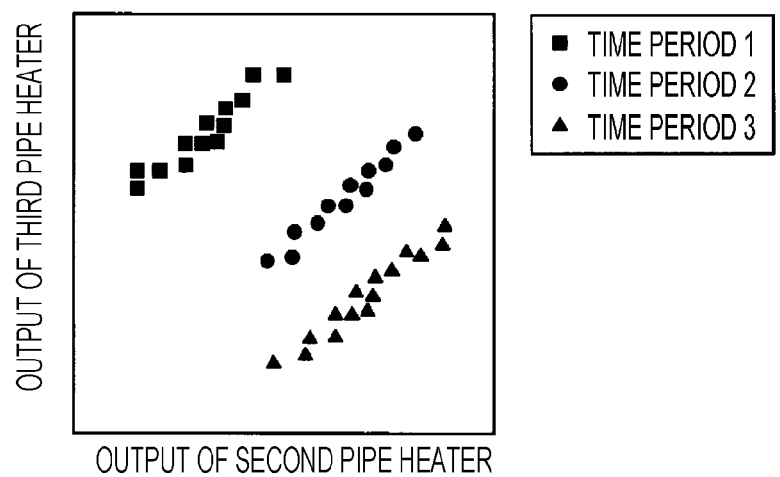

FIGS. 10A to 10C are views illustrating yet another example of the point data list, and represent a case where the sensor for detecting the output of the first pipe heater is abnormal. FIG. 10A is a scatter plot that represents the correlation between the output of the first pipe heater and the output of the second pipe heater, in which the horizontal axis represents the output of the first pipe heater, and the vertical axis represents the output of the second pipe heater. FIG. 10B is a scatter plot that represents the correlation between the output of the first pipe heater and the output of the third pipe heater, in which the horizontal axis represents the output of the first pipe heater, and the vertical axis represents the output of the third pipe heater. FIG. 10C is a scatter plot that represents the correlation between the output of the second pipe heater and the output of the third pipe heater, in which the horizontal axis represents the output of the second pipe heater, and the vertical axis represents the output of the third pipe heater. In FIGS. 10A to 10C, a square mark indicates point data in "Time Period 1," a circle mark indicates point data in "Time Period 2," and a triangle mark indicates point data in "Time Period 3."

As illustrated in FIG. 10A, the slope of the regression line calculated based on the scatter plot that represents the correlation between the output of the first pipe heater and the output of the second pipe heater is a "negative value." Thus, it may be determined that the sensor for detecting the output of the first pipe heater or the sensor for detecting the output of the second pipe heater is abnormal. Further, as illustrated in FIG. 10B, the slope of the regression line calculated based on the scatter plot that represents the correlation between the output of the first pipe heater and the output of the third pipe heater is a "negative value." Thus, it may be determined that the sensor for detecting the output of the first pipe heater or the sensor for detecting the output of the third pipe heater is abnormal. Further, as illustrated in FIG. 10C, the slope of the regression line calculated based on the scatter plot that represents the correlation between the output of the second pipe heater and the output of the third pipe heater is a "positive value." Thus, it may be determined that the sensor for detecting the output of the second pipe heater and the sensor for detecting the output of the third pipe heater are not abnormal. From these results, it may be identified that the sensor for detecting the output of the first piping heater is abnormal.

In this way, by determining an abnormality of sensors based on three sensor values correlated with each other, an abnormal sensor may be identified.

In the embodiment above, the apparatus controller 12 is an example of a controller, and the group management controller 40 is an example of an abnormality detecting apparatus. The point data list is an example of correlation data. Further, the first pipe heater and the first pressure control valve are an example of a first monitoring target, the second pipe heater and the second pressure control valve are an example of a second monitoring target, and the third pipe heater is an example of a third monitoring target.

In the embodiment above, the pipe heaters and the pressure control valves are described as an example of monitoring targets. However, the present disclosure is not limited thereto. For example, the monitoring target may be a mass flow controller.

In the embodiment above, descriptions are made on a case where the group management controller 40 executes the abnormality detecting method. However, the present disclosure is not limited thereto. For example, the apparatus controller 12, the terminal 60, and the host computer may execute the abnormality detecting method.

According to the present disclosure, an abnormality sign of a semiconductor manufacturing apparatus may be detected in advance.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An abnormality detecting apparatus for a semiconductor manufacturing apparatus comprising:
    a monitor for obtaining data from the semiconductor manufacturing apparatus, from at least one group of a plurality of correlated sensors, the at least one group including:
    a first output sensor, for detecting an output of a pipe heater, in communication with a supply pipe of the pipe heater, the supply pipe through which gas is supplied into a processing container, wherein the supply pipe includes a first supply pipe attached to the pipe heater and a second supply pipe connected to other pipe heaters in the semiconductor manufacturing apparatus, wherein the first output sensor is in communication with the first supply pipe;
    second output sensors in communication with an exhaust pipe, the second output sensors attached to the exhaust pipe that exhausts the processing container;
    or,
    opening degree sensors, in communication with a pressure control valve of outlets of the processing container, for detecting the degree that the pressure control valve is opened, wherein the pressure control valve is provided in the exhaust pipe;
    a controller configured to 1) generate correlation data from data received from the at least one group of the correlated sensors, the correlation data comprising point data from each of the correlated sensors comprising a value and a time, the time associated with a predetermined time period of a sequence of one or more predetermined time periods, and 2) send the generated correlation data to a storage unit;
    a data processor configured to: 1) obtain the correlation data for the predetermined time period, which is a last predetermined time period of the sequence of predetermined time periods, from the storage unit, and 2) determine whether the point data of the correlation data, which was obtained, includes at least a predetermined number of point data; and
    a calculator configured to, when the point data of the correlation data, which was obtained, includes at least a predetermined number of point data: 1) arrange the correlation data and fit a regression line to the arranged correlation data, and 2) calculate a slope of the regression line of the correlation data;
    wherein the controller is configured to determine an abnormality of the semiconductor manufacturing apparatus based on the slope of the regression line, and to signal when the abnormality is determined.

2. The abnormality detecting apparatus according to claim 1, wherein the controller determines that the semiconductor manufacturing apparatus is abnormal, when the slope of the regression line falls outside a control value.

3. The abnormality detecting apparatus according to claim 1, wherein the calculator calculates a coefficient of determination of the regression line of the correlation data based on the correlation data, and
    the controller is configured to determine whether the coefficient of determination of the regression line is within a predetermined range for a control value.

4. The abnormality detecting apparatus according to claim 1, wherein the controller generates new correlation data in the predetermined time period after each time a maintenance of the semiconductor manufacturing apparatus is executed.

5. The abnormality detecting apparatus according to claim 1,
    wherein the controller is configured to output the abnormality of the semiconductor manufacturing apparatus when the controller determines that the semiconductor manufacturing apparatus is abnormal.

6. The abnormality detecting apparatus according to claim 1, wherein the calculator: 1) arranges the correlation data obtained from at least two of the first output sensors, the second output sensors, or the opening degree sensors and fits a regression line to each one of the correlation data, and 2) calculates slopes of regression lines for each one of the correlation data, and the controller determines an abnormality of the semiconductor manufacturing apparatus based on the slopes of the regression lines.

7. A semiconductor manufacturing apparatus comprising:
    a controller configured to detect an abnormality of the semiconductor manufacturing apparatus,
    wherein the controller includes:
    a monitor for obtaining data from the semiconductor manufacturing apparatus, from at least one group of a plurality of correlated sensors, the at least one group including:
    a first output sensor, for detecting an output of a pipe heater, in communication with a supply pipe of the pipe heater, the supply pipe through which gas is supplied into a processing container, wherein the supply pipe includes a first supply pipe attached to the pipe heater and a second supply pipe connected to other pipe heaters in the semiconductor manufacturing apparatus, wherein the first output sensor is in communication with the first supply pipe;

second output sensors in communication with an exhaust pipe, the second output sensors attached to the exhaust pipe that exhausts the processing container;

or, opening degree sensors, in communication with a pressure control valve of outlets of the processing container, for detecting the degree that the pressure control valve is opened, wherein the pressure control valve is provided in the exhaust pipe;

wherein the controller is configured to 1) generate correlation data from data received from the at least one group of the correlated sensors, the correlation data comprising point data from each of the correlated sensors comprising a value and a time, the time associated with a predetermined time period of a sequence of one or more predetermined time periods, and 2) send the generated correlation data to a storage unit;

a data processor configured to: 1) obtain the correlation data for the predetermined time period, which is a last predetermined time period of the sequence of predetermined time periods, from the storage unit, and 2) determine whether the point data of the correlation data, which was obtained, includes at least a predetermined number of point data; and a calculator configured to, when the point data of the correlation data, which was obtained, includes at least a predetermined number of point data: 1) arrange the correlation data and fit a regression line to the arranged correlation data, and 2) calculate a slope of the regression line of the correlation data;

wherein the controller is configured to determine an abnormality of the semiconductor manufacturing apparatus based on the slope of the regression line, and to signal when the abnormality is determined.

8. The semiconductor manufacturing apparatus according to claim 7, wherein the calculator: 1) arranges the correlation data obtained from at least two of the first output sensors, the second output sensors, or the opening degree sensors and fits a regression line to each one of the correlation data, and 2) calculates slopes of the regression lines for each one of the correlation data, and wherein the controller determines an abnormality of the semiconductor manufacturing apparatus based on the plurality of slopes of regression lines.

9. An abnormality detecting method comprising:

obtaining data from a semiconductor manufacturing apparatus, from at least one group of correlated sensors, the at least one group including:

a first output sensor, for detecting an output of a pipe heater, in communication with a supply pipe of the pipe heater, the supply pipe through which gas is supplied into a processing container, wherein the supply pipe includes a first supply pipe attached to the pipe heater and a second supply pipe connected to other pipe heaters in the semiconductor manufacturing apparatus, wherein the first output sensor is in communication with the first supply pipe;

second output sensors in communication with an exhaust pipe, the second output sensors attached to the exhaust pipe that exhausts the processing container; or, opening degree sensors, in communication with a pressure control valve of the outlets of the processing container, for detecting the degree that the pressure control valve is opened, wherein the pressure control valve is provided in the exhaust pipe;

generating correlation data based on the data received from the at least one group of the correlated sensors, the correlation data comprising point data from each of the correlated sensors comprising a value and a time, the time associated with a predetermined time period of a sequence of one or more predetermined time periods;

sending the generated correlation data to a storage unit;

processing the correlation data including: 1) obtaining the correlation data for the predetermined time period, which is a last predetermined time period of the sequence of predetermined time periods, from the storage unit, and 2) determining whether the point data of the correlation data, which was obtained, includes at least a predetermined number of point data; and when the point data of the correlation data, which was obtained, includes at least a predetermined number of point data:

arranging the correlation data;

fitting a regression line to the arranged correlated data;

calculating a slope of the regression line of the correlation data;

determining an abnormality of the semiconductor manufacturing apparatus based on the slope of the regression line; and signaling when the abnormality is determined.

* * * * *